United States Patent [19]

Braginetz et al.

[11] 4,329,005
[45] May 11, 1982

[54] SLIDE CAM MECHANISM FOR POSITIONING TEST ADAPTER IN OPERATIVE RELATIONSHIP WITH A RECEIVER

[76] Inventors: Paul A. Braginetz, 214 Oak Ridge Cir., Staunton, Va. 24401; Quentin E. Cline, P.O. Box 501, 221 Eleventh St., Grottoes, Va. 24441; Paul D. Floyd, P.O. Box B, Lyndhurst, Va. 22952

[21] Appl. No.: 136,289

[22] Filed: Apr. 1, 1980

[51] Int. Cl.³ .......................................... H01R 25/00
[52] U.S. Cl. ................................................. 339/18 B
[58] Field of Search ................. 339/18 R, 18 B, 75 R, 339/75 M, 88, 90

[56] References Cited

U.S. PATENT DOCUMENTS

| | | | |
|---|---|---|---|
| 3,166,369 | 1/1965 | Trump | 339/18 B |
| 3,323,095 | 5/1967 | Bush et al. | 339/18 B |
| 3,341,801 | 9/1967 | Brookman et al. | 339/18 B |
| 3,419,842 | 12/1968 | Taylor, Jr. | 339/18 B |

Primary Examiner—Joseph H. McGlynn
Assistant Examiner—Frank H. McKenzie, Jr.
Attorney, Agent, or Firm—B. P. Fishburne, Jr.

[57] ABSTRACT

A receiver includes an inner frame and outer walls. Between the outer walls and adjacent side of the receiver frame are placed fixed hanger plates provided with straight slots and interior slides having coacting cam slots. The slides are driven by a hand lever and attached torsion shaft with connected slotted linkage having an over-dead-center locked position. An individual test adapter has four sets of dual bearings or rollers on common dry lube sleeves and can rotate oppositely during the camming action to minimize friction. The individual test adapter rollers rest on dwell shoulders of the cam slots and then descend through the straight slots during movement of the slides to produce positive straight-on engagement of test adapter and receiver multiple contacts, such as ball detent contacts with paddle contacts. The slides have elongated linear guide bearings with attached dry lube pads for precision free movement. A single pilot pin and opening at one corner of the individual test adapter and receiver eliminates lateral play. The system can be expanded so that the receiver can accept two individual test adapters in tandem or a single large individual test adapter.

8 Claims, 21 Drawing Figures

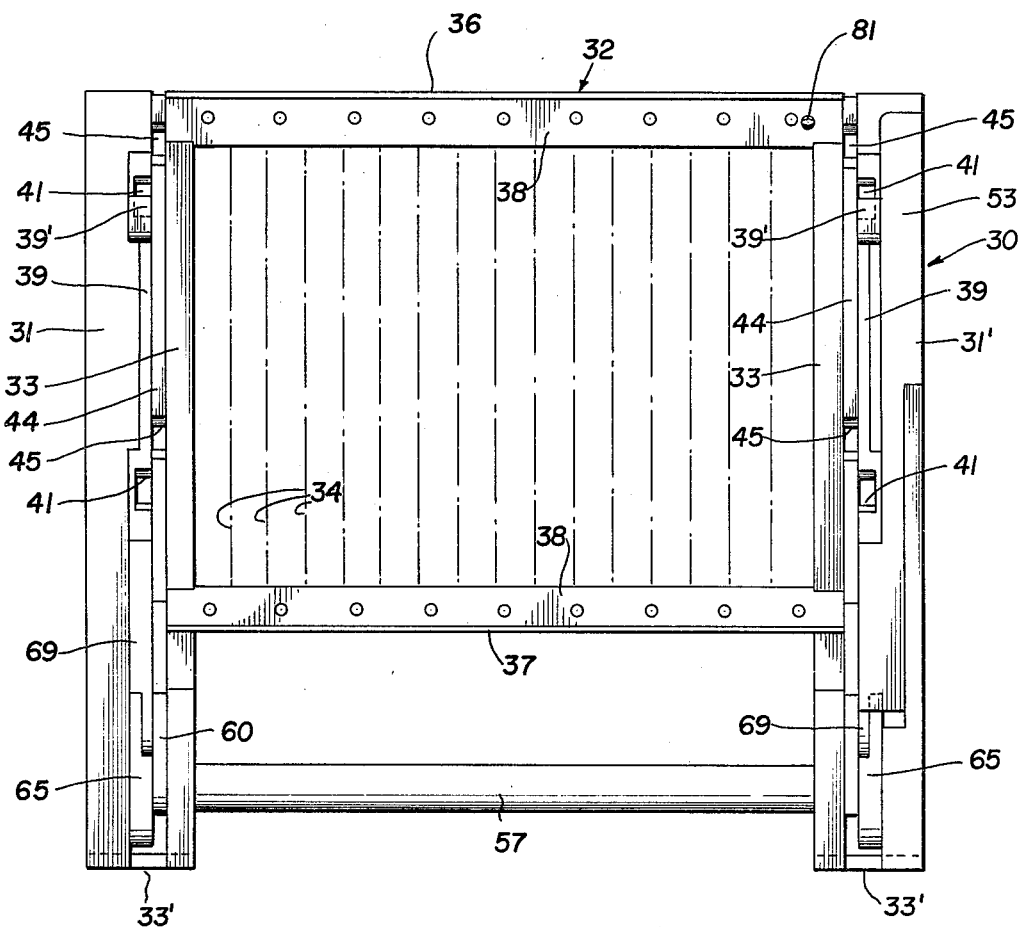
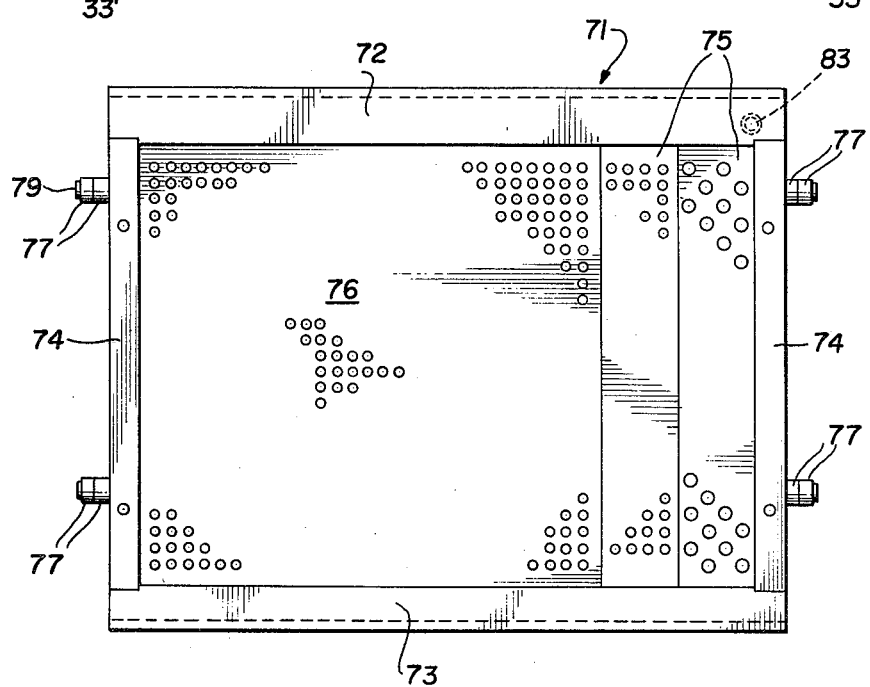

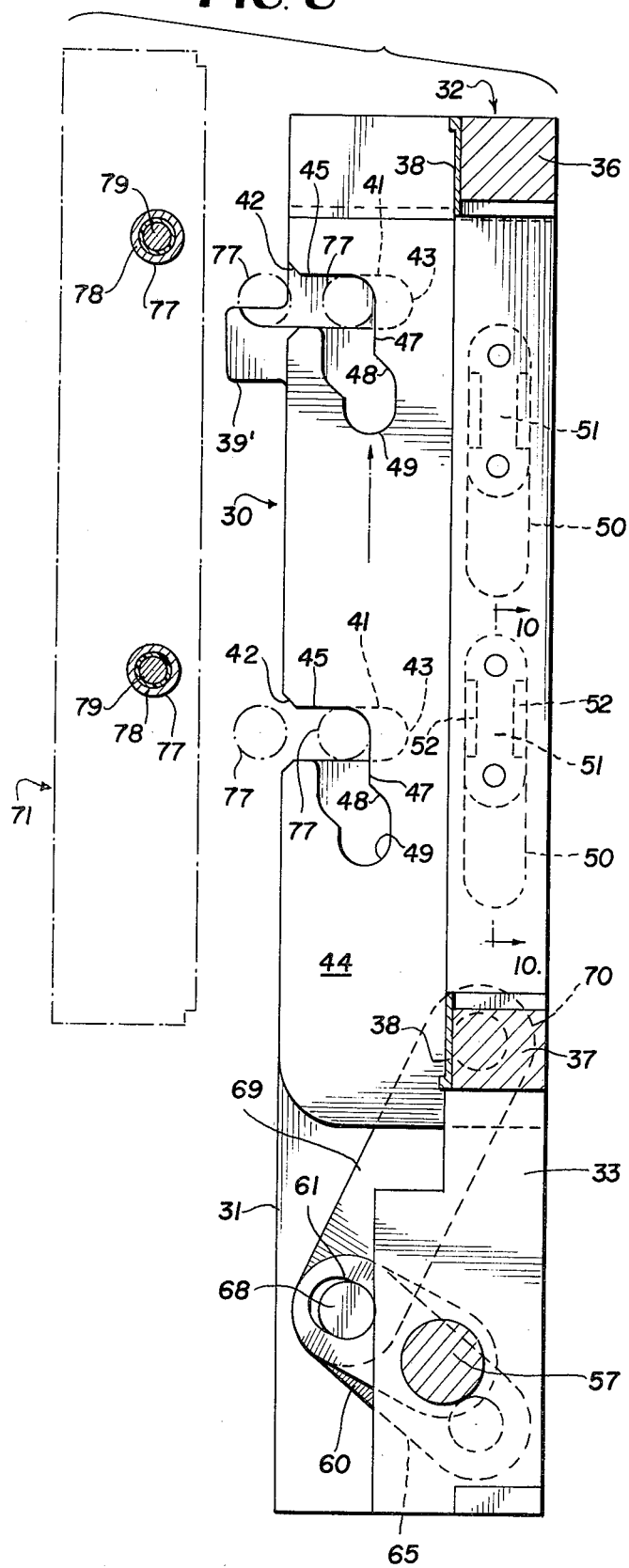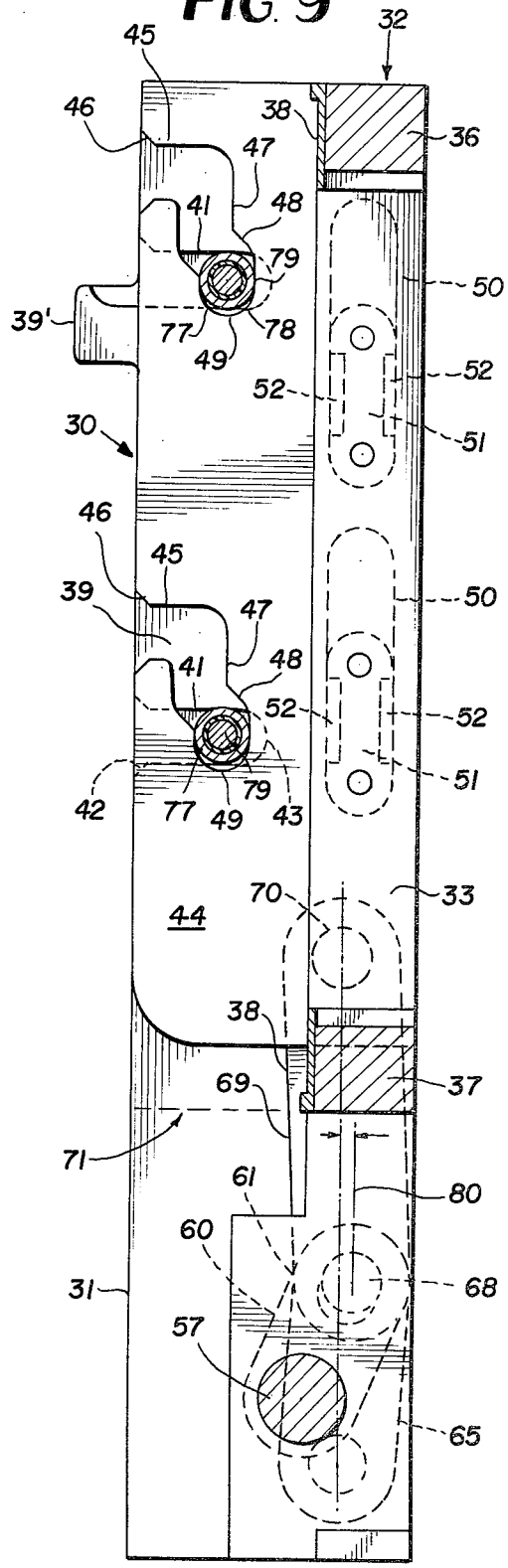

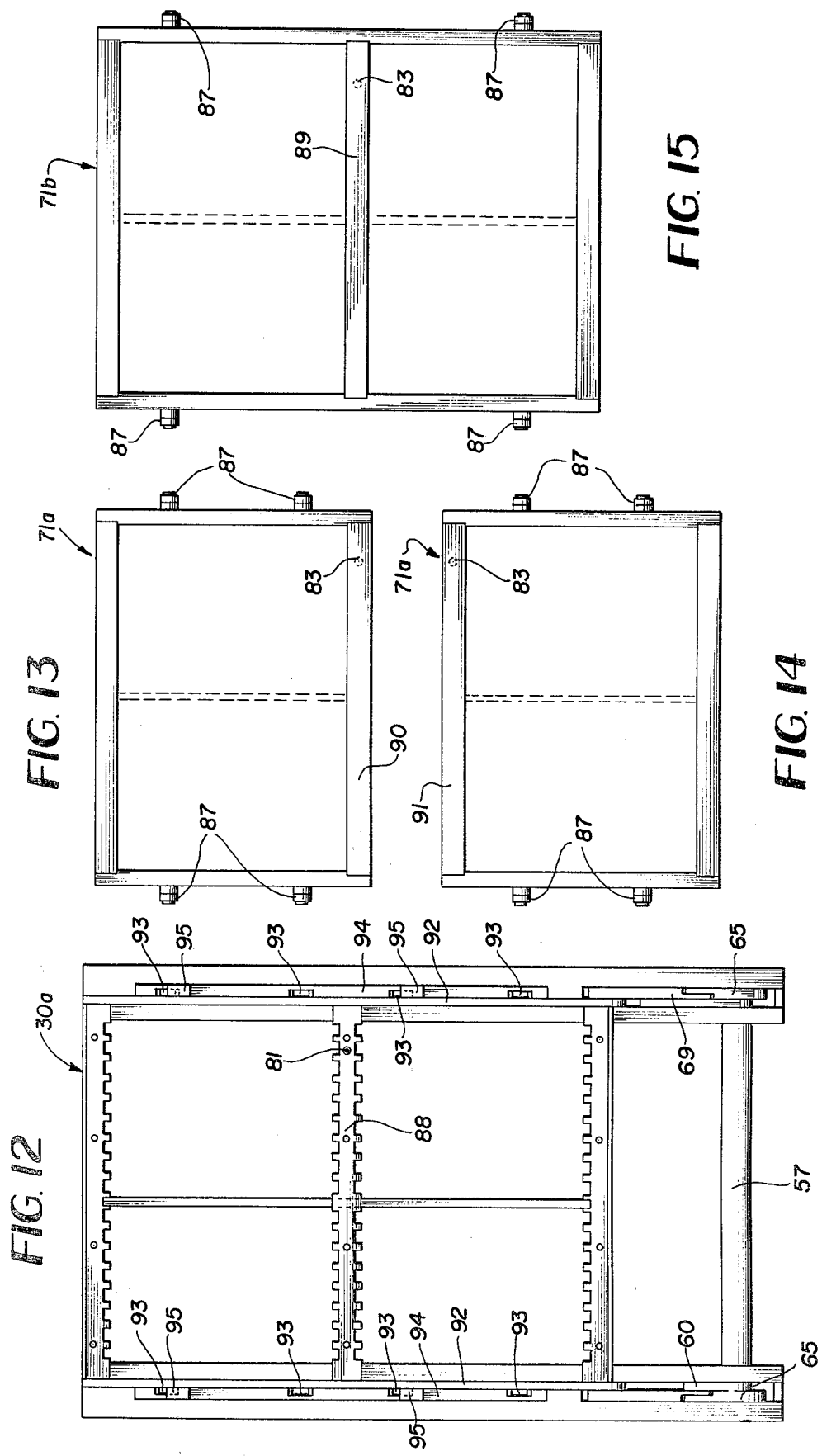

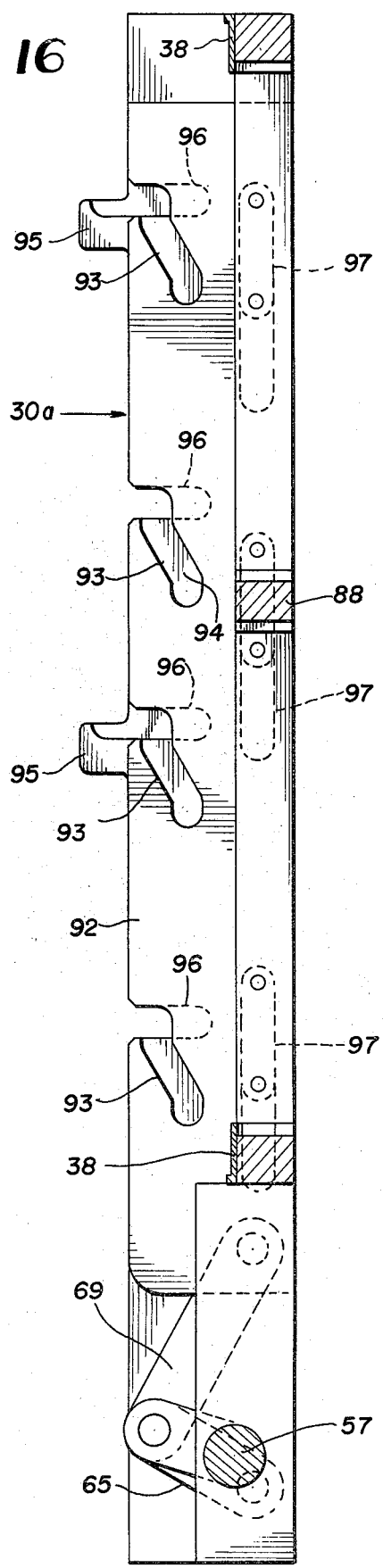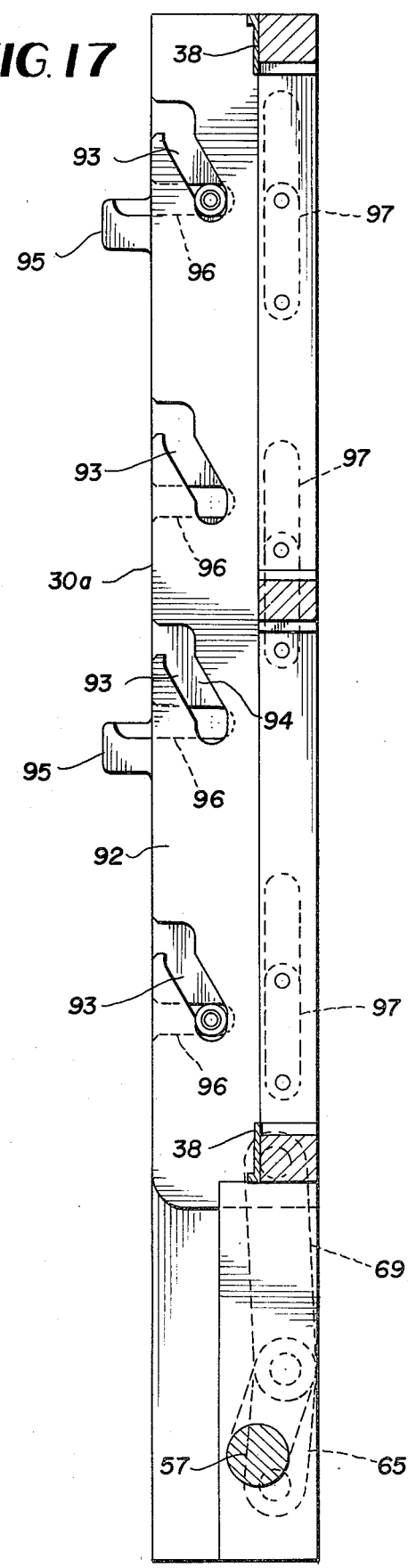

4,329,005

SLIDE CAM MECHANISM FOR POSITIONING TEST ADAPTER IN OPERATIVE RELATIONSHIP WITH A RECEIVER

BACKGROUND OF THE INVENTION

The invention relates broadly to electrical connectors and more particularly to that specialized class of connectors which are increasingly required in computer interface equipment. Such equipment requires the frequent placement of individual test adapters with their multiple ranks and files of minute electrical contacts in operative engagement with the coacting electrical contacts of receivers. It is imperative that the receiver contacts and individual test adapter contacts engage with precision to minimize wear and to prevent damaging the delicate and expensive equipment.

The present invention seeks to satisfy the increasingly exacting demands of the art through provision of a very sturdy and durable precision mechanism which functions to engage the multiple ranks and files of electrical contacts, such as ball detent contacts with paddle contacts in a linear or straight-on mode as distinguished from other types of engagement where contacts initially move together in a first plane and then travel into final engagement in a second orthogonal plane.

In fulfilling the above need in the art, the present invention makes use of a receiver having an inner rectangular frame and outer side walls spaced from adjacent parallel sides of the inner frame. Fixed hanger plates equipped with straight guide slots whose axes are normal to the contact plane of the receiver are placed outwardly of precision slides in the spaces between the receiver outer walls and the sides of the receiver inner frame. The two slides are driven in unison by a single hand lever with attached torsion shaft, to the opposite ends of which are connected over-dead-center locking slotted drive linkages.

The coacting individual test adapter is equipped with opposite side pairs of dual rollers on common dry lube sleeves which enable the rollers of the pairs to rotate oppositely during the camming action to minimize friction. The slides also have dry lube elongated bearings for precision guidance with low friction during linear travel. Lateral play between the individual test adapter and the receiver is prevented by engagement of a single pilot pin in a broached opening near one corner of the assembly. Precision machining tolerances are required only in portions of the cam slots and not throughout the entire drive system for the slides.

While no known device in the prior art comes close to satisfying the requirements which the invention seeks to completely satisfy, the following prior United States patents of general interest only relative to the invention are typical of the known prior art and are referred to herein to satisfy the requirements of 37 C.F.R. 1.56:

U.S. Pat. Nos. 2,927,295, 3,217,284, 3,341,801, 4,134,631.

Other features and advantages of the invention will become apparent during the course of the following description.

BRIEF DESCRIPTION OF THE DRAWINGS

FIG. 1 is a plan view of a receiver constructed in accordance with the invention.

FIG. 2 is a plan view of an individual test adapter in accordance with the invention.

FIG. 8 is a vertical section through the receiver taken on line 8—8 of FIG. 3 and showing the coacting individual test adapter in phantom lines and partly in cross section prior to engagement with the receiver.

FIG. 9 is a view similar to FIG. 8 showing the individual test adapter engaged with the receiver by the interaction of camming means on the receiver with guide rollers on the individual test adapter.

FIG. 12 is a plan view of an expanded receiver in accordance with a modification of the invention.

FIG. 13 is a plan view showing one of two individual test adapters which the receiver in FIG. 12 can accept.

FIG. 14 is a plan view of a second individual test adapter which the receiver in FIG. 12 can accept.

FIG. 15 is a plan view of a single individual test adapter which the receiver in FIG. 12 can accept.

FIG. 16 is a vertical section similar to FIG. 8 taken through the receiver shown in FIG. 12.

FIG. 17 is a side elevation of the receiver in FIG. 12 with one receiver engaged therein.

DETAILED DESCRIPTION

Figure 3:
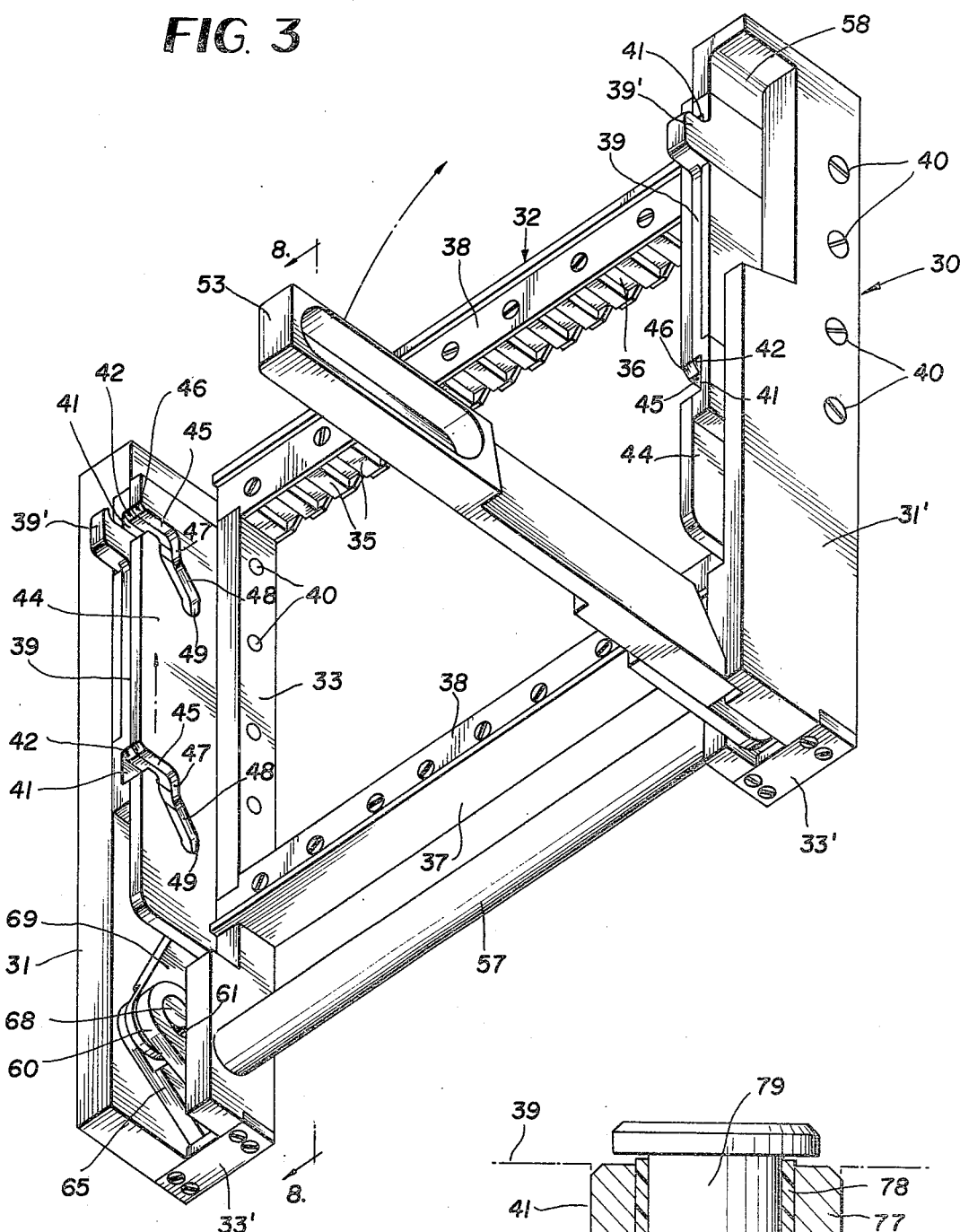
FIG. 3 is a perspective view of the receiver.

Referring to the drawings in detail wherein like numerals designate like parts, the numeral 30 designates a receiver having outer side walls 31 and 31' and an inner rectangular frame 32 including sides 33 spaced inwardly from and parallel to the outer walls 31 and 31'. The outer side walls 31 and 31' are connected to frame sides 33 through rigid connecting means 33'. Typically, sixteen replaceable module bars 34 shown in phantom lines in FIG. 1 carrying multiple electrical contacts in predetermined arrays have their opposite ends received in spaced notches 35 formed in the opposing faces of top and bottom rails 36 and 37 of the inner frame 32 by means of screws. The frame 32 and modules 34 are assembled in accordance with the prior art. Radio frequency interference shields 38 and 38', FIG. 3, are attached to the forward and rear faces of the rails 36 and 37 as shown.

Figure 10:
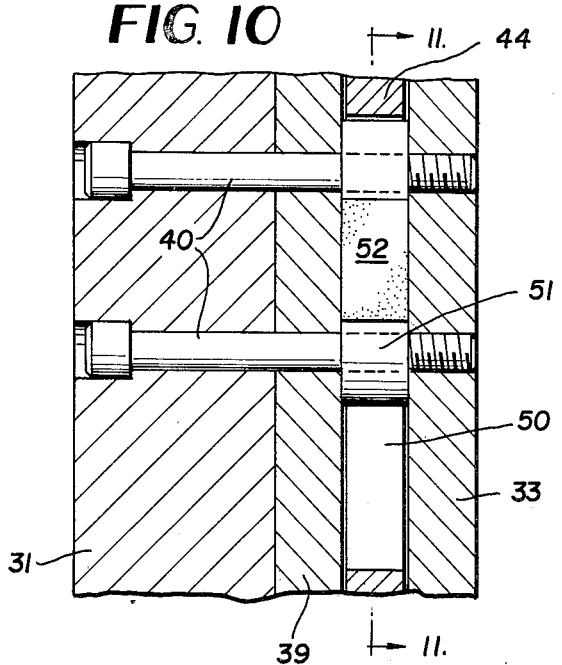
FIG. 10 is an enlarged fragmentary vertical section taken on line 10—10 of FIG. 8.
Figure 11:
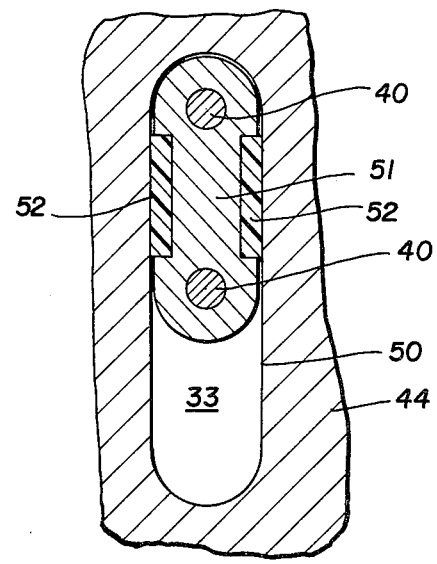
FIG. 11 is a similar view taken on line 11—11 of FIG. 10.

Stationary hanger plates 39 having upwardly facing hangers 39' are secured by bolts 40 rigidly to the outer walls 31 and 31' and frame sides 33 of the receiver, FIG. 10. These stationary hanger plates 39 have spaced parallel straight guide slots 41 in their inner faces and extending normal to the plane in which the receiver electrical contacts on the modules 34 are located. The slots 41 have beveled entrances 42 and rounded closed ends 43.

Coacting slide plates 44 lie inwardly of the fixed hanger plates 39 and between them and the side members 33 of frame 32. These slide plates have spaced cam slots formed through their forward edges including straight slot portions 45 of the same widths and parallel to the straight slots 41 and adapted to register therewith when the slide plates 44 are in certain positions. The cam slots have beveled entrances 46, as shown. The cam slots have dwell portions or shoulders 47 at right angles to the straight slots 41 of the fixed hanger plates 39 and at right angles to the cam slot portions 45. From the dwell portions 47, the cam slots extend to include inclined sections 48 extending to slot terminals 49 which are closed and rounded, as shown. The degree of slope for cam slot sections 48 may be varied, and slope angles of 30 degrees or 45 degrees are satisfactory. A 45 degree slope angle is illustrated in FIGS. 8 and 9 but this should not be taken in a limiting sense and in many cases 30 degrees is the preferred angle of inclination. The operation of the profiled cam slots in relation to the straight slots 41 will be fully described hereinafter.

Near their rear edges, slide plates 44 have spaced tandem longitudinal guide slots 50 formed therethrough receiving elongated guide bearings 51 held against movement in the assembly by the bolts 40. These bearings have attached dry lube bearing pads 52 to minimize friction in the linear sliding movement of the slide plates 44 on the receiver.

The two slide plates 44 are moved in unison with precision by a single hand lever 53 near one lower corner of the receiver 30. The hand lever 53 is attached at elements 54 and 55 to an extension 56 of a torsion shaft 57 near the bottom of the receiver held in bearings on frame sides 33 and extending parallel to the rail 37. The hand lever 53, when swung forwardly from the outstanding position in FIG. 3 toward the plane of the receiver 30, is received in a pocket 58 formed partly in the adjacent outer wall 31' and by the arrangement of the adjacent fixed hanger plate 39. The hand lever can lie flush with the rear face of the outer wall 31' when in the provided pocket 58.

The hand lever has a slot 59 spaced from the axis of the torsion shaft 57 and on the other side of the receiver a drive link 60 having a similarly located and shaped slot 61 is attached to an extension 62 of the shaft 57 as by elements 63 and 64.

At each side of the receiver, a link 65 has one end pivoted through elements 66 and 67 with the receiver outer walls 31 and 31'. The links 65 are connected through pivot pins 68 with toggle links 69 which are in turn pivotally attached at 70 to slide plates 44. The aforementioned slots 59 and 61 of hand lever 53 and drive link 60 also receive pivot pins 68 as best shown in FIGS. 8 and 9 to form a lost motion connection imparting to each toggle linkage composed of links 65 and 69 an over-dead-center locking capability illustrated in FIG. 9 when the hand lever 53 is swung upwardly and forwardly into the pocket 58.

The receiver 30 operates in conjunction with an individual test adapter 71 of rectangular form including rigidly connected top and bottom rails 72 and 73 and side members 74. The individual test adapter 71 may include predetermined numbers of replaceable modules 75 having various arrays of electrical contacts thereon requiring engagement with the coacting contacts on the receiver modules 34. The test adapter may also include a comparatively large panel 76 having multiple ranks and files of electrical contacts of the same type or a different type from those contacts on the modules 75, such as ball detent contacts suitable for electrical engagement with paddle contacts on the receiver 30. It should be understood that the electrical contact patterns and types on both the receiver and individual test adapter may vary and the mechanism forming the present invention is not limited in its use to any particular contact arrangement or type as long as the contacts on the receiver and individual test adapter are constructed and positioned for proper engagement under influence of the slide cam mechanism forming the subject matter of the invention.

The rectangular individual test adapter 71 carries on its opposite side members 74 four sets of dual rollers 77 or bearings, with each pair or set mounted for rotation on a common dry lube sleeve 78 enabling the rollers in each pair to rotate oppositely during the camming action of the mechanism in order to minimize friction. The pairs of rollers 77 and their sleeves 78 are mounted on short headed shafts 79 firmly anchored in openings provided in the side members 74 of the individual test adapter.

The rollers 77 of the individual test adapter are sized and spaced on the test adapter to freely enter the straight slots 41 of the fixed hanger plates 39 and the entrance cam slot sections 45 of slide plates 40 on opposite sides of the receiver 30 when such straight slots and slot sections are in registration as depicted in FIGS. 3 and 8. This condition of slot registration will occur when the hand lever 53 is in the open or outstanding position relative to the receiver 30 shown in FIG. 3, the normal use position of the receiver 30 to accept the individual test adapter being upright or vertical with the connecting plates 33' engaging a level support surface.

With the receiver 30 in such an upright position, the pairs of rollers 77 nearest the upper rail 72 of the individual test adapter are merely placed supportively on the rearwardly projecting hanger elements 39' whose supporting surfaces are in alignment with the entrances of the straight slots 41 and registering cam slot entrance portions 45, see FIG. 8. The engagement of the uppermost pairs of rollers 77 with hanger elements 39' will position the lower pairs of rollers 77 on the individual test adapter 71 for entry into the lower straight slots 41 and cam slot entrance sections 45, as shown in FIG. 8.

Figure 7:
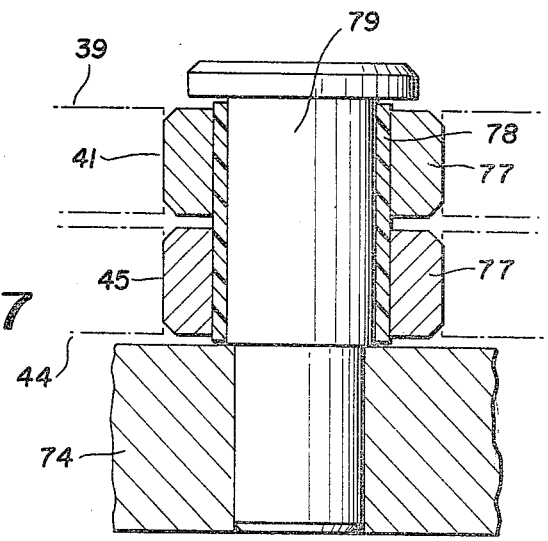
FIG. 7 is an enlarged fragmentary vertical section taken on line 7—7 of FIG. 4.

After such positioning of the individual test adapter, the same may be pushed straight on toward the plane of the receiver 30 and the four pairs or sets of rollers 77 will move readily through the straight slots 41 and registering cam slot sections 45 until the interior rollers 77 of the four pairs contact the dwell sections or shoulders 47 of the cam slots in the slide plates 44. It must be understood, as shown in FIG. 7 where fragments of one fixed hanger plate 39 and one slide plate 44 are shown in phantom lines, that the rollers 77 of each pair are located and sized axially so that the outer roller can only enter the straight slot 41 and the inner roller can only enter the straight entrance section 45 of the cam slot in slide plate 44.

With all of the outer rollers 77 of the pairs engaging cam slot shoulders 47, the contacts of the receiver 30 and individual test adapter 71 are not yet engaged but are close to engagement. All that remains to be done is to swing hand lever 53 into the pocket 58 of the receiver, substantially 90 degrees of movement, and when this is done, the shaft 57 is rotated a corresponding amount and the described slots 59 and 61 of the hand lever and drive link 60 are likewise rotated. This rotation in turn drives the pins 68 and the pins 68 are moved from their initial positions in FIG. 8 to their positions in FIG. 9 where the two toggle linkages composed of links 65 and 69 are flattened out and finally reach the past dead center locked position indicated by the center line 80 in FIG. 9. At this time, the hand lever 53 is home in the recess 58 of outer wall 31'.

During this movement of the hand lever, shaft 57 and toggle linkages, the two slide plates 44 are advanced upwardly or toward receiver top rail 36, as indicated by the directional arrow in FIG. 3. This same slide plate movement is depicted in FIG. 9 where the limit of movement of the slide plates 44 is illustrated, FIG. 8, showing the slide plates 44 before they begin to move and therefore corresponding to FIG. 3.

As slide plates 44 are advanced in unison, the cam slot shoulders 47 will advance across the perpendicular straight stationary slots 51 without displacing the outer rollers 77 of the individual test adapter. However, when the inclined slot sections 48 pass across straight slots 41, they will cammingly engage the outer rollers 77 in each pair and positively force these rollers to move deeper into the straight slots 41 which, in turn, displaces the entire individual test adapter 71 in the same direction, namely, straight on toward the receiver 30 while the test adapter and receiver remain parallel. This camming action induced by the movement of inclined slot sections 48 relative to the inner rollers 77 forces the exterior rollers 77 which are restrained by the straight slots 41 toward the closed ends of the straight slots, FIG. 9, until their limit of travel is reached by entry of the inner rollers in the terminal portions 49 of the cam slots. When this condition is reached, the multitudes of electrical contacts on individual test adapter 71 are fully and uniformly engaged with the paddle contacts of the receiver 30. The respective contacts are also securely locked in engagement by the over-dead-center locking action of the toggle linkages composed of links 65 and 69. Similarly, the inner rollers 77 of the individual test adapter 71 are locked in the terminal sections 49 of the cam slots in slide plates 44, as shown in FIG. 9. Reverse movement of the hand lever 53 to its stand out position shown in FIG. 3 will return the various parts to their relative positions shown in FIG. 8 allowing quick separation of the individual test adapter 71 from the receiver 30.

To fully appreciate what the invention accomplishes, it must be realized that the few ounces of resistance to engagement offered by each pair of contacts on the individual test adapter and receiver multiplied by the large number of pairs of mating contacts adds up to a tremendous resistance force opposing the interfacing of the two assemblies. The mechanism embodied in the invention affords a powerful evenly applied precision guided, engaging, locking and release means which prevents damage to delicate contacts, thus increasing their life span, and also assuring on a repetitive basis optimum electrical continuity between the interfaced assemblies 71 and 30.

Another important feature of the invention contributing to the good results achieved is the provision near one corner of the receiver frame 32 of a single locator pin 81 anchored within an opening 82 of the upper frame rail 36. The active portion of the locator pin 81 preferably has the polygonal cross sectional shape shown in FIG. 6 and is received in a broached hexagonal opening 83 of a bushing 84 held within an opening 85 of one side member 74 of individual test adapter 71.

Figure 6:
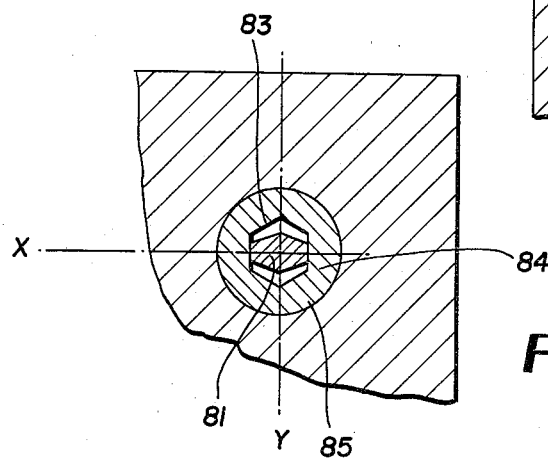
FIG. 6 is a fragmentary vertical section taken on line 6—6 of FIG. 5.

The engagement of locator pin in broached opening 83 during engagement of the two assemblies eliminates lateral play. Referring to FIG. 6, the broached hole 83 allows some Y-axis movement but no movement on the X-axis. The arrangement contributes materially to the efficiency and precision operation of the device.

Figure 18:
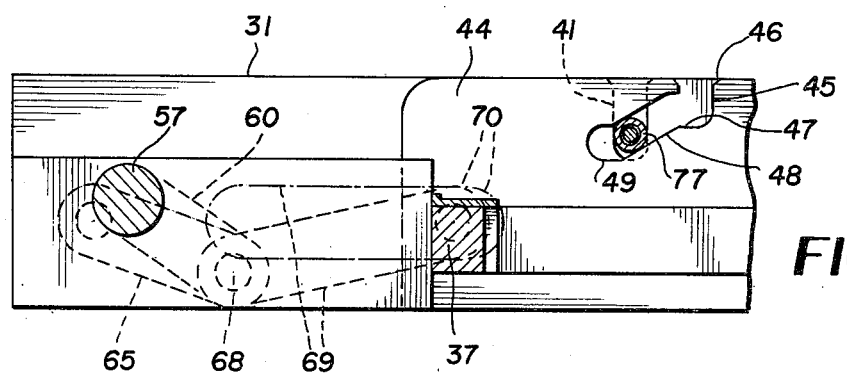
FIG. 18 is a fragmentary vertical section, similar to FIG. 9, showing an arrangement for producing minute reverse wiping action between engaged electrical contacts in accordance with a variant of the invention.
Figure 19:
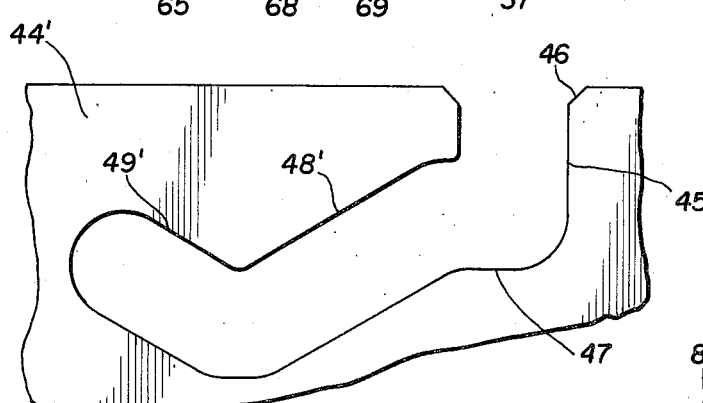
FIG. 19 is a fragmentary side elevation of another arrangement for producing minute reverse wiping action between engaged contacts.

As an optional but desirable feature of the invention to further assure good electrical continuity, slight reverse wiping action between the electrical contacts of the receiver 30 and individual test adapter 71 can be achieved according to either of two means illustrated in FIGS. 18 and 19. In FIG. 18, the toggle linkage operated by hand lever 53 is slightly modified to enable the linkage 65-69 to break beyond dead center in the locked position as much as approximately 10 degrees, compared to about 2 or 3 degrees of over-dead-center breaking in FIG. 9 which does not provide for the contact reverse wiping feature. With this increased movement of the toggle links in FIG. 18, the inner rollers 77 of the individual test adapter will be cammed first into the closed terminals 49 of the cam slots by closing of the hand lever 53 and then will be moved on a reverse path by a distance indicated at 70 in FIG. 18 to cause the rollers 77 to climb a slight distance upwardly on inclined cam slot portions 48 to thereby provide the desired reverse wiping action between the engaged contacts.

In FIG. 19, the identical results can be achieved by a slight modification of the cam slot profile in slide plates 44'. Terminal end sections 49' inclined oppositely to the sections 48' are provided and the linear travel of slide plates 44' is slightly increased, with the result that closing of hand lever 53 to the lock position will cause the guide rollers 77 to descend to the bottoms of slot sections 48' and then to climb slightly up the slot sections 49', resulting in the same contact reverse wiping action achieved with the linkage modification in FIG. 18.

Figure 20:
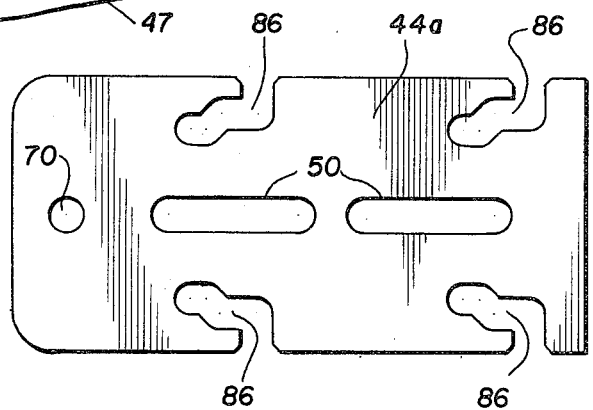
FIG. 20 is a side elevational view of a cam slide having cam slots formed in both of its longitudinal edges in accordance with a modification of the invention.

FIG. 20 depicts a further capability of the invention whereby two individual test adapters, not shown, may have their contacts drawn or cammed simultaneously into operative engagement with mating contacts of a receiver. To accomplish this, slide plates 44a are provided in the receiver assembly substantially as described but are provided in both of their opposite longitudinal edges with cam slots 86 shaped in accordance with the previous description instead of in one edge only according to the prior main embodiment.

As shown in FIGS. 12 through 17 of the drawings, a receiver 30a constructed and operating in the manner already described can be expanded to accept a pair of equal size individual test adapters 71a for a single expanded individual test adapter 71b having a total electrical contact capacity equal to the combined capacities of test adapters 71a. Each individual test adapter 71a and 71b is equipped with four dual guide roller assemblies 87 in accordance with the previous description.

The expanded receiver 30a has a mid-rail 88 equipped with the described single locator pin 81 near one end thereof to enter the described broached opening 83 on a corresponding mid-rail 89 of expanded test adapter 71b or on a bottom rail 90 or top rail 91 of individual test adapters 71a. That is to say, the expanded test adapter 71b or either one of the test adapters 71a can be used selectively in the expanded receiver 30a but not simultaneously, and neither can both individual test adapters 71a be interfaced simultaneously with the receiver 30a.

Figure 3A:
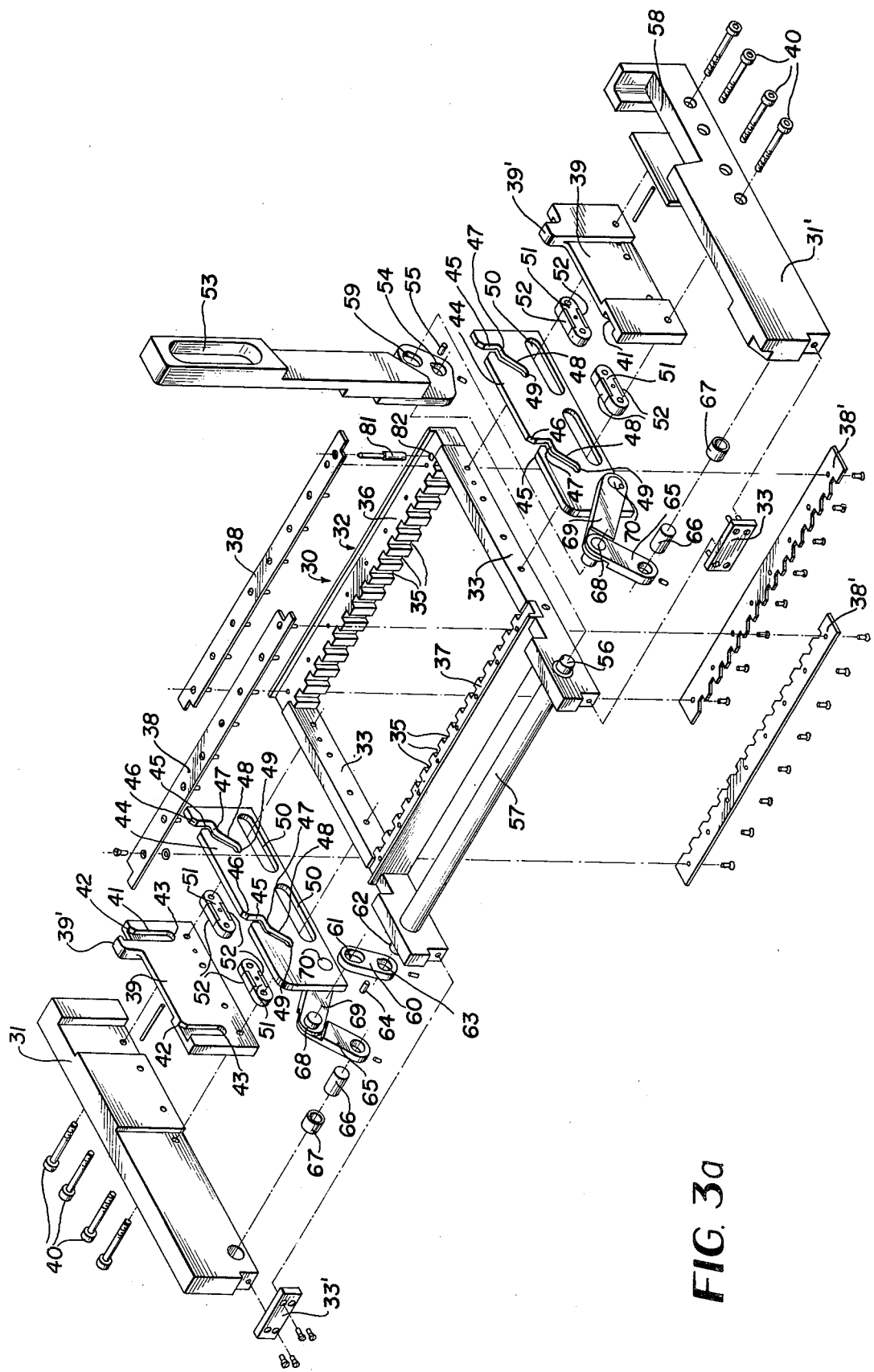
FIG. 3A is an exploded perspective view of the receiver.
Figure 4:
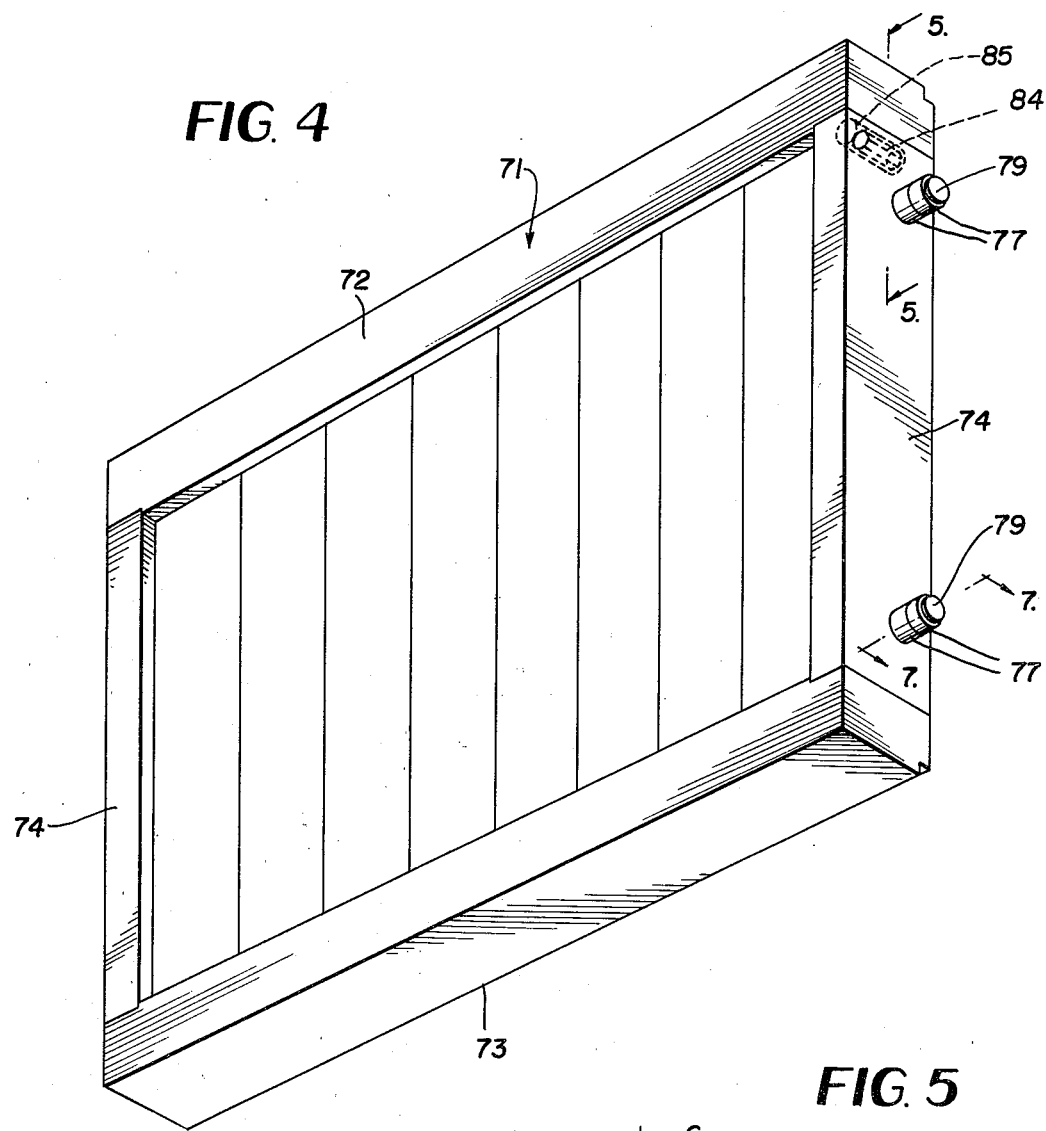
FIG. 4 is a perspective view of the individual test adapter.
Figure 5:
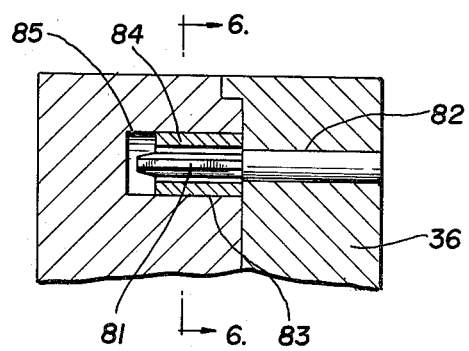
FIG. 5 is an enlarged fragmentary vertical section taken on line 5—5 of FIG. 4.

As shown in FIGS. 16 and 17, the expanded receiver 30a is equipped with similarly expanded slide plates 92 in accordance with the previous description of the embodiment in FIGS. 3 and 3A and such slide plates are provided at properly spaced intervals with four of the described cam slots 93 rather than a single pair as in the prior embodiment. Likewise, lengthened or expanded fixed hanger plates 94 are provided on the receiver 30a including a pair of hanger elements 95 instead of a single such element as on the fixed hanger plates 39. The expanded fixed hanger plates 94 likewise have four straight slots 96 instead of the two straight slots 41 of hanger plates 39.

The operating means for the slide plates 92 including hand lever, torsion shaft 57 and dual over-dead-center locking toggle linkages including links 65 and 69 is substantially as described in the previous embodiment and need not be redescribed in detail for a proper understanding of the modification in FIGS. 12 through 17. Likewise, the expanded linear dry lube guide bearing means for the expanded slide plates 92 is essentially as described previously and is shown at 97 in FIGS. 16 and 17.

The mode of operation for locking any one of the individual test adapters 71a or 71b with the expanded receiver 30a is identical to the described operation for locking the individual test adapter 71 in the receiver 30 and need not be repeated.

In all forms of the invention, the inclined portions of the cam slots in the slide plates may be on 30 degree or 45 degree angles, and in all forms of the invention the reverse wiping capability for electrical contacts explained relative to FIGS. 18 and 19 may be included or omitted as required. In all forms of the invention, the camming means firmly and evenly forces the contacts of the individual test adapter into engagement with mating contacts of the receiver with a straight on positive linear movement because of the straight guide slots 41, etc. in the fixed hanger plates 39, etc.

The advantages of the invention over the prior art should now be fully apparent to those skilled in the art.

It is to be understood that the forms of the invention herewith shown and described are to be taken as preferred examples of the same, and that various changes in the shape, size and arrangement of parts may be resorted to, without departing from the spirit of the invention or scope of the subjoined claims.

We claim:

1. A mechanism for positioning a test adapter in operative relationship with a receiver comprising a receiver body, fixed hanger plates on opposite sides of the receiver body having spaced straight guide slots which are parallel and whose axes are normal to an electrical contact plane of the receiver, reciprocating slide plates on opposite sides of the receiver body extending adjacent to the fixed hanger plates and having spaced profiled cam slots including entrance portions parallel to said straight slots and adapted in one position of the slide plates to register with entrance portions of the straight slots, manually operable means on the receiver body to reciprocate said slide plates in unison relative to the fixed hanger plates between test adapter release and locking positions, a test adapter including side members and pairs of spaced projecting locator elements on the side members adapted for precision engagement within said straight slots of the fixed hanger plates and said cam slots of the reciprocating slide plates, and said projecting locator elements each comprising a pair of side-by-side independent rollers adapted to engage respectively within a straight slot of a fixed hanger plate and a cam slot of a slide plate, said rollers being capable of reverse rotation during the camming action induced by reciprocation of said slide plates.

2. A mechanism as defined in claim 1, and a common dry lube bearing sleeve for each pair of rollers, and a support shaft element for each dry lube bearing sleeve and its rollers on the side members of said test adapter.

3. A mechanism for positioning a test adapter in operative relationship with a receiver comprising a receiver body, fixed hanger plates on opposite sides of the receiver body having spaced straight guide slots which are parallel and whose axes are normal to an electrical contact plane of the receiver, reciprocating slide plates on opposite sides of the receiver body extending adjacent to the fixed hanger plates and having spaced profiled cam slots including entrance portions parallel to said straight slots and adapted in one position of the slide plates to register with entrance portions of the straight slots, manually operable means on the receiver body to reciprocate said slide plates in unison relative to the fixed hanger plates between test adapter release and locking positions, a test adapter including side members and pairs of spaced projecting locator elements on the side members adapted for precision engagement within said straight slots of the fixed hanger plates and said cam slots of the reciprocating slide plates, said reciprocating slide plates having longitudinal guide slots formed therethrough and cooperating stationary elongated guide bearing elements on said opposite sides of the receiver body engaging within said longitudinal guide slots, each side of the receiver body comprising an outer wall and an inner receiver frame side spaced from the outer wall, each fixed hanger plate disposed immediately inwardly of the outer wall and each reciprocating slide plate disposed between the fixed hanger plate and the inner receiver frame side, and bolt means fixedly interconnecting said outer wall, fixed hanger plate, inner receiver frame side and said elongated guide bearing elements at each side of the receiver body.

4. A mechanism as defined in claim 3, and dry lube bearing insert pads on said guide bearing elements in sliding contact with the walls of said longitudinal guide slots of said slide plates.

5. A mechanism as defined in claim 3, and one outer wall of said receiver body having a recess receiving a hand lever forming a part of said manually operable means.

6. A mechanism for positioning a test adapter in operative relationship with a receiver comprising a receiver body, fixed hanger plates on opposite sides of the receiver body having spaced straight guide slots which are parallel and whose axes are normal to an electrical contact plane of the receiver, reciprocating slide plates on opposite sides of the receiver body extending adjacent to the fixed hanger plates and having spaced profiled cam slots including entrance portions parallel to said straight slots and adapted in one position of the slide plates to register with entrance portions of the straight slots, manually operable means on the receiver body to reciprocate said slide plates in unison relative to the fixed hanger plates between test adapter release and locking positions, a test adapter including side members and pairs of spaced projecting locator elements on the side members adapted for precision engagement within said straight slots of the fixed hanger plates and said cam slots of the reciprocating slide plates, said manually operable means on the receiver body comprising a swingable hand lever, a torsion shaft coupled to and driven by the hand lever, and simultaneously operable over-dead-center locking drive linkages driven by the hand lever and shaft and coupled with the reciprocating slide plate to shift them between unlocked test adapter release positions and locked test adapter retaining positions.

7. A mechanism as defined in claim 6, and said over-dead-center linkages comprising a pair of toggle linkages having lost motion connections with said hand lever and said torsion shaft.

8. A mechanism as defined in claim 7, and means to produce a minute reverse wiping action between the engaged electrical contacts of a receiver and test adapter including the over-dead-center travel distance of said toggle linkages.

* * * * *